United States Patent
Kito et al.

(10) Patent No.: US 7,812,756 B2
(45) Date of Patent: Oct. 12, 2010

(54) PIPELINE A/D CONVERTER AND DIGITAL CAMERA

(75) Inventors: Takayasu Kito, Osaka (JP); Shinichi Ogita, Kyoto (JP)

(73) Assignee: Panasonic Corporation, Osaka (JP)

( * ) Notice: Subject to any disclaimer, the term of this patent is extended or adjusted under 35 U.S.C. 154(b) by 71 days.

(21) Appl. No.: 12/398,551

(22) Filed: Mar. 5, 2009

(65) Prior Publication Data

US 2009/0225185 A1 Sep. 10, 2009

(30) Foreign Application Priority Data

Mar. 7, 2008 (JP) ............................. 2008-057936

(51) Int. Cl.
*H03M 1/44* (2006.01)
(52) U.S. Cl. ....................................... 341/162; 341/172
(58) Field of Classification Search ................. 341/161, 341/162, 163, 172, 156
See application file for complete search history.

(56) References Cited

U.S. PATENT DOCUMENTS

| | | | |
|---|---|---|---|
| 5,629,700 A * | 5/1997 | Kumamoto et al. ......... | 341/161 |
| 6,304,206 B1 | 10/2001 | Wada et al. | |
| 6,683,554 B2 * | 1/2004 | Nikai et al. ................. | 341/161 |
| 6,791,484 B1 * | 9/2004 | Lee et al. ..................... | 341/118 |
| 2006/0022861 A1* | 2/2006 | Kudoh et al. ................. | 341/155 |
| 2006/0125676 A1* | 6/2006 | Kobayashi .................. | 341/155 |

2007/0290915 A1 12/2007 Morimoto

FOREIGN PATENT DOCUMENTS

JP 2007-324834 A 12/2007

OTHER PUBLICATIONS

Pan, H. et al. "A 3.3-V 12-b 50-MS/s A/D Converter in 0.6-μm CMOS with over 80-dB SFDR", IEEE Journal of Solid-State Circuits, vol. 35, No. 12, Dec. 2000, pp. 1769-1780.

* cited by examiner

*Primary Examiner*—Howard Williams
(74) *Attorney, Agent, or Firm*—Hamre, Schumann, Mueller & Larson, P.C.

(57) ABSTRACT

In each of a plurality of stages, an input analog signal is quantized, so that a digital signal corresponding to each part of bits is generated. ADA conversion portion generates an analog reference signal based on the digital signal, and a remainder operation portion performs addition/subtraction and amplification by a predetermined factor with respect to the input analog signal. Then, the signal thus obtained is supplied to a subsequent stage. The DA conversion portion in the first stage where A/D conversion of a plurality of bits is performed includes primary voltage supply portions capable of outputting a reference voltage at one of a plurality of levels, and an auxiliary voltage supply portion capable of outputting a reference voltage at an auxiliary level different from the above-described level. The respective voltage supply portions selectively output the reference voltages based on a digital signal generated by an AD conversion portion. Based on a combination of the output reference voltages, the analog reference signal in accordance with the digital signal is generated. It is possible to reduce power consumption while suppressing an increase in the area of an element.

6 Claims, 6 Drawing Sheets

| Vin | Voltage supply portions | | | | | | | | Vdac |
|---|---|---|---|---|---|---|---|---|---|
| | 1 | 2 | 3 | 4 | 5 | 6 | 7 | 8 | |
| A | 0 | 1 | 1 | 1 | 1 | 1 | 1 | 1 | +7 |
| B | -1 | 1 | 1 | 1 | 1 | 1 | 1 | 1 | +6 |
| C | 0 | 1 | 1 | 1 | 1 | 1 | 1 | -1 | +5 |
| D | -1 | 1 | 1 | 1 | 1 | 1 | 1 | -1 | +4 |
| E | 0 | 1 | 1 | 1 | 1 | 1 | -1 | -1 | +3 |
| F | -1 | 1 | 1 | 1 | 1 | 1 | -1 | -1 | +2 |
| G | 0 | 1 | 1 | 1 | 1 | -1 | -1 | -1 | +1 |
| H | -1 | 1 | 1 | 1 | 1 | -1 | -1 | -1 | 0 |
| I | 0 | 1 | 1 | 1 | -1 | -1 | -1 | -1 | -1 |
| J | -1 | 1 | 1 | 1 | -1 | -1 | -1 | -1 | -2 |
| K | 0 | 1 | 1 | -1 | -1 | -1 | -1 | -1 | -3 |
| L | -1 | 1 | 1 | -1 | -1 | -1 | -1 | -1 | -4 |
| M | 0 | 1 | -1 | -1 | -1 | -1 | -1 | -1 | -5 |
| N | -1 | 1 | -1 | -1 | -1 | -1 | -1 | -1 | -6 |
| O | 0 | -1 | -1 | -1 | -1 | -1 | -1 | -1 | -7 |

PIPELINE A/D CONVERTER AND DIGITAL CAMERA

BACKGROUND OF THE INVENTION

1. Field of the Invention

The present invention relates to a pipeline A/D converter that converts an analog input signal into a digital signal in descending order of bit significance by using a plurality of stages, each of which quantizes the analog input signal so as to generate the digital signal.

2. Description of Related Art

As digitization proceeds in the fields of audiovisual, telecommunication, and the like, it has been required for A/D converters used as key devices in these fields to achieve higher speed and higher resolution. Pipeline A/D converters recently have been used frequently as circuits that are excellent in terms of high speed and power consumption. However, as CCD cameras have an increasing number of pixels, for example, pipeline A/D converters that are excellent in terms of high speed and power consumption also are required to achieve much higher speed and lower power consumption.

FIG. 2 is a block diagram showing a configuration of a basic pipeline A/D converter. This pipeline A/D converter includes n stages, i.e., a first stage 1[1] to an n-th stage 1[n], connected in cascade, and a flash AD converter 2 in a final stage. An input analog signal Vin is converted into a digital signal one bit by one bit by each of the n stages in descending order of bit significance, and the digital signal thus obtained is combined with an output digital signal from the flash AD converter 2, whereby an output digital signal is obtained as a result of converting the input analog signal Vin at a desired bit number.

Although FIG. 2 shows a specific configuration of only the first stage 1[1], the other stages also have the same configuration. That is, each of the stages includes an AD conversion portion 3, a DA conversion portion 4, and a remainder operation portion 5.

The AD conversion portion 3 converts the input analog signal supplied to a current stage into a ternary digital signal, and outputs the same. This digital signal also is supplied to the DA conversion portion 4. The DA conversion portion 4 converts the digital signal output from the AD conversion portion 3 into an analog signal so as to generate an analog reference signal, and supplies the same to the remainder operation portion 5. The remainder operation portion 5 subtracts the analog reference signal output of the DA conversion portion 4 from the input analog signal supplied to the current stage, and amplifies the obtained analog signal, thereby generating a remainder analog signal. The output signal from the remainder operation portion 5 is supplied to a subsequent stage as an input analog signal.

FIG. 3A shows a specific configuration for achieving a predetermined function by the DA conversion portion 4 and the remainder operation portion 5. The DA conversion portion 4 includes a logical operation portion 6 and a voltage supply portion 7. Other components, i.e., an operational amplifier 8, an input capacitor Cs, a feedback capacitor Cf, and switches 9 to 11, configure the remainder operation portion 5 in FIG. 2. The analog reference signal output from the DA conversion portion 4 is supplied to a connection node between the input capacitor Cs and the switch 9. In the following description, the capacitance values of the input capacitor Cs and the feedback capacitor Cf are represented by Cs and Cf, respectively.

The voltage supply portion 7 has three switches connected with three reference voltages +Vref, 0 V, and −Vref, respectively. The logical operation portion 6 outputs a signal for switching the switches of the voltage supply portion 7 based on the value of the digital signal output from the AD conversion portion 3. Thus, in the voltage supply portion 7, one of the three reference voltages is selected in accordance with the value of the digital signal, and an analog reference signal Vdac is supplied to the input capacitor Cs.

Next, an operation of this circuit will be described. In FIG. 3A, a clock Φ1 and a dock Φ2 take a high level (H) value and a low level (L) value mutually exclusively. When the clock Φ1 is H and the clock Φ2 is L, the switches 9 and 10 are ON and the switch 11 is OFF, so that an input analog signal Vin is sampled by the input capacitor Cs.

When the dock Φ1 is L and the dock Φ2 is H, the switches 9 and 10 are OFF and the switch 11 is ON, so that the electric charge sampled by the input capacitor Cs is redistributed to the input capacitor Cs and the feedback capacitor Cf. Further, the logical operation portion 6 is operated, so that the voltage supply portion 7 supplies the analog reference signal Vdac to the input capacitor Cs. As a result, the operational amplifier 8 outputs an output signal Vout expressed as follows.

$$V\text{out} = \{(Cs+Cf)/Cf\} \cdot V\text{in} - (Cs/Cf) \cdot Vdac \quad (1)$$

When Cs=Cf, the following formula is satisfied.

$$V\text{out} = 2 \cdot V\text{in} - Vdac \quad (2)$$

The output signal Vout from the operational amplifier 8 will be described also with reference to FIG. 3B. In FIG. 3B, a horizontal axis represents the input analog signal Vin to each of the stages. A vertical axis represents the output signal Vout from the operational amplifier 8. As shown in the figure, the level of the input analog signal Vin on the horizontal axis is divided into a first region (−Vref to −Vref/4), a second region (−Vref/4 to +Vref/4), and a third region (+Vref/4 to +Vref).

The AD conversion portion 3 generates the ternary digital signal from the input analog signal Vin by using the reference voltage corresponding to a boundary of each of the regions. Based on the output digital signal from the AD conversion portion 3, the logical operation portion 6 controls the voltage supply portion 7 so that one of the voltages +Vref, 0 V, and −Vref is output corresponding to each of the first to third regions. Further, as a result of the operation of the above-described formula (2), the output signal Vout from the operational amplifier 8 with respect to the input analog signal Vin is as shown in FIG. 3B.

As described above, the analog reference signal is generated in accordance with the level of the input analog signal Vin, and addition/subtraction is performed with respect to the input analog signal Vin, whereby the output signal Vout from the operational amplifier 8 can be prevented from exceeding an input range of the AD conversion portion 3 in a subsequent stage.

Based on the pipeline A/D converter as described above, it has been known to revise the configure such that the first stage has a multi-bit configuration, i.e., performs conversion of a plurality of bits, so as to reduce power consumption (see JP 2007-324834 A, for example). More specifically, as shown in FIG. 4, conversion functions of the first to third stages 1[1] to 1[3] in the basic configuration in FIG. 2 are integrated into one first stage 12, in which an AD conversion portion 3a, a DA conversion portion 4a, and a remainder operation portion 5a are modified in accordance with such a function.

In the pipeline structure, the operational amplifiers in the respective stages consume a dominant amount of power. In view of this, when the first stage 12 has a multi-bit configuration as shown in FIG. 4, it becomes possible to perform conversion that has been performed in the three stages in the basic configuration with one operational amplifier, thereby serving to reduce power consumption.

In order for a first stage to have a multi-bit configuration, it is necessary to modify the function of the stage as shown in FIGS. 5A and 5B. More specifically, the functions of the three stages in the basic configuration shown in FIG. 5A are integrated into one stage as shown in FIG. 5B. The outputs from the remainder operation portions 5[1] to 5[3] in FIG. 5A are represented by transfer functions 13[1] to 13[3], respectively. Note here that the transfer functions 13[2] and 13[3] show the functions from the first stage collectively. The transfer function 13[1] output from the remainder operation portion 5[1] in the first stage, which is the same as that shown in FIG. 3B, corresponds to the ternary digital signal output from the AD conversion portion.

The transfer function 13[2] output from the remainder operation portion 5[2] in the second stage corresponds to a septenary digital signal, and the transfer function 13[3] output from the remainder operation portion 5[3] in the third stage corresponds to a quindecimal digital signal. FIG. 5B shows that the one remainder operation portion 5a achieves the functions of the three stages in FIG. 5A. To this end, the remainder operation portion 5a needs to perform eight-fold amplification, while the remainder operation portions 5[1] to 5[3] in FIG. 5A perform two-fold amplification.

However, when the first stage has a multi-bit configuration, the DA conversion portion used in the first stage becomes exponentially larger in size. This will be described with reference to FIGS. 6A and 6B. FIG. 6A shows a stage with a multi-bit configuration. This stage includes an AD conversion portion 14, a logical operation portion 15, voltage supply portions 16[1] to 16[16], an operational amplifier 8, input capacitors Cs, a feedback capacitor Cf, and switches 17 and 18.

The sixteen input capacitors Cs, which are connected in parallel with each other, are used, and an input analog signal Vin is supplied to first ends thereof and the other ends thereof are connected to an input terminal of the operational amplifier 8. The switch 17 is inserted in one end of each of the input capacitors Cs. The sixteen voltage supply portions 16[1] to 16[16] and the logical operation portion 15 configure a DA conversion portion, and the operational amplifier 8, the input capacitors Cs, the feedback capacitor Cf, and the switches 17 and 18 configure a remainder operation portion.

As shown in FIG. 6A, the voltage supply portion 16[1] includes two switches 19a and 19b. A high-potential reference voltage VRT and a low-potential reference voltage VRB are supplied to input sides of the switches 19a and 19b, respectively. Output sides of the switches 19a and 19b are connected to a connection node between any pair of the input capacitor Cs and the switch 17. The switches 19a and 19b are switched by the logical operation portion 15 in accordance with a digital signal output from the AD conversion portion 14. The other voltage supply portions 16[2] to 16[16] also have the same configuration.

With this configuration, each of the voltage supply portions 16[1] to 16[16] selectively outputs either of the two reference voltages VRT and VRB in accordance with the output from the AD conversion portion 14. As a result, based on a combination of the respective reference voltages supplied from the voltage supply portions 16[1] to 16[16] to the sixteen input capacitors Cs, practically, a quindecimal analog reference signal Vdac in accordance with the output from the AD conversion portion 14 is supplied to the reminder operation portion. The reminder operation portion is operated basically in the same manner as described with reference to FIG. 3A, and outputs a transfer function based on the quindecimal quantization as shown in FIG. 5B.

The table of FIG. 6B shows the relationship between a combination of the reference voltages VRT and VRB selected by the voltage supply portions 16[1] to 16[16] and the value of the analog reference signal Vdac. In the table, A to O (E to M are not shown) shown in the leftmost column correspond to the levels of the input analog signal Vin, more specifically, to fifteen values obtained as a result of the quantization by the AD conversion portion 14. Further, (−7) to (+7) ((−5) to (+3) are not shown) shown in the rightmost column represent the relative levels of the analog reference signal Vdac. The voltage supply portions (1 to 16) in the uppermost column correspond to the voltage supply portions 16[1] to 16[16], and the reference voltage selected by the switches 19a and 19b is shown in a lower column of each of the voltage supply portions. More specifically, "−1" shows that the reference voltage VRB is selected, while "1" shows that the reference voltage VRT is selected.

As described above, in order to perform A/D conversion of three bits, it is necessary to generate the analog reference signal Vdac at fifteen levels from (−7) through 0 to (+7), and this requires the use of sixteen voltage supply portions 16[1] to 16[16]. In general, the number of the voltage supply portions to be required is determined as $2^{(M+1)}$ in accordance with the number of bits (M) to be converted in the current stage. Accordingly, the DA conversion portion becomes exponentially larger, which leads to disadvantages such as an increase in the area of an element, an increase in the complexity of wiring, and difficulty in routing wiring in a layout.

Further, in the case of a multi-bit configuration, the capacitance value of the input capacitors Cs is divided equally by the number of the voltage supply portions. Namely, in the case of the configuration in FIG. 6A, the capacitance value of the input capacitor Cs is set to be $\frac{1}{2}^{(M+1)}$ times a total capacitance value. When one unit of the capacitors is small in size, relative accuracy decreases, which appears as an error of the pipeline A/D converter. Thus, in order to satisfy relative accuracy, it is necessary to increase a total capacitance, which also contributes to an increased area of an element.

SUMMARY OF THE INVENTION

Therefore, it is an object of the present invention to provide a pipeline A/D converter that can reduce power consumption while suppressing an increase in the area of an element.

A pipeline A/D converter according to the present invention has a plurality of stages connected in cascade, each performing A/D conversion for each part of bits, so as to convert an analog signal input to a first stage into a digital signal sequentially in descending order of bit significance through the plurality of stages. Each of the stages includes: an AD conversion portion that quantizes the input analog signal of a current stage so as to generate the digital signal corresponding to the part of bits; a DA conversion portion that generates an analog reference signal based on the digital signal output from the AD conversion portion; and a remainder operation portion that adds/subtracts the analog reference signal to/from the input analog signal of the current stage and amplifies the obtained analog signal by a predetermined factor so as to generate a remainder analog signal, and supplies the reminder analog signal to a subsequent stage as the input analog signal.

In order to solve the above-described problems, the first stage among the plurality of stages is configured to perform A/D conversion of a plurality of bits. The DA conversion portion of the first stage includes: a plurality of primary voltage supply portions capable of selectively outputting a reference voltage at one of a plurality of predetermined levels; and at least one auxiliary voltage supply portion capable of outputting a reference voltage at an auxiliary level different from the level of the reference voltage output from the primary voltage supply portions. The reference voltages output respectively from the primary voltage supply portions and the auxiliary voltage supply portion are controlled so as to be selected based on the digital signal generated by the AD conversion portion, and based on a combination of the outputs from the primary voltage supply portions and the auxiliary voltage supply portion, the analog reference signal in accordance with the digital signal is generated.

With the above-described configuration, A/D conversion of a plurality of bits is performed in the first stage. Accordingly, only one operational amplifier is used for the conversion that has been performed in a plurality of stages in the conventional example, thereby reducing power consumption. Further, the provision of the auxiliary voltage supply portion capable of outputting a reference voltage at an auxiliary level helps to reduce the number of the voltage supply portions for use in the first stage, thereby suppressing an increase in the block area of the DA conversion portion. Consequently, it is possible to avoid an increase in the area of an element, an increase in the complexity of wiring, and complication in routing wiring in a layout.

Further, the number of the input capacitors also is reduced, and accordingly the capacitance value corresponding to the reduction is maintained. As a result, it becomes possible to make one unit of the input capacitors larger in size, thereby suppressing an increase in the area of an element resulting from ensuring the relative accuracy of the input capacitors.

DETAILED DESCRIPTION OF THE INVENTION

Based on the above-described configuration, the pipeline A/D converter of the present invention may have the following aspects.

More specifically, the reference voltage at the auxiliary level may be set at a level between the plurality of levels of the reference voltage to be output from the primary voltage supply portions.

Further, the reference voltage to be output from the auxiliary voltage supply portion may include a reference voltage at least one of the plurality of levels of the reference voltage to be output from the primary voltage supply portions, in addition to the reference voltage at the auxiliary level.

Further, the primary voltage supply portions may output the reference voltage at either of two levels, that is, a high-potential level and a low-potential level, and the reference voltage to be output from the auxiliary voltage supply portion may include the reference voltage at the auxiliary level between the high-potential level and the low-potential level and a reference voltage at either the high-potential level or the low-potential level.

Further, the first stage may be configured to perform A/D conversion of three bits, and seven primary voltage supply portions and the one auxiliary voltage supply portion may be provided.

Further, it is possible to provide a digital camera including the pipeline A/D converter according to any of the above-described configurations.

Figure 1A:
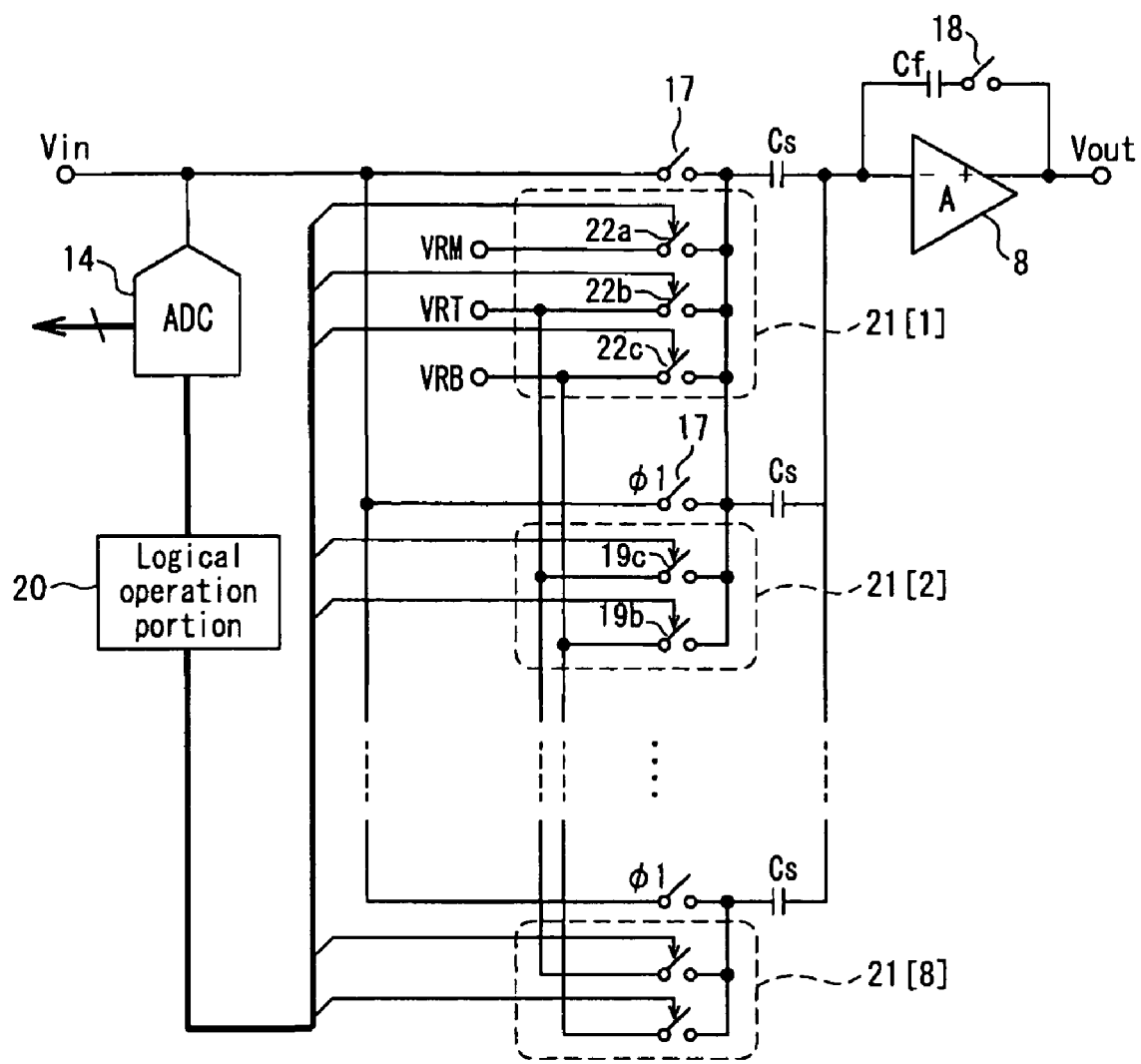
FIG. 1A is a block diagram showing a configuration of a first stage of a pipeline A/D converter according to an embodiment of the present invention.

Hereinafter, an embodiment of the present invention will be described with reference to the drawings. FIG. 1A is a block diagram showing a configuration of a primary portion, i.e., a first stage, of a pipeline A/D converter according to an embodiment of the present invention.

Figure 4:
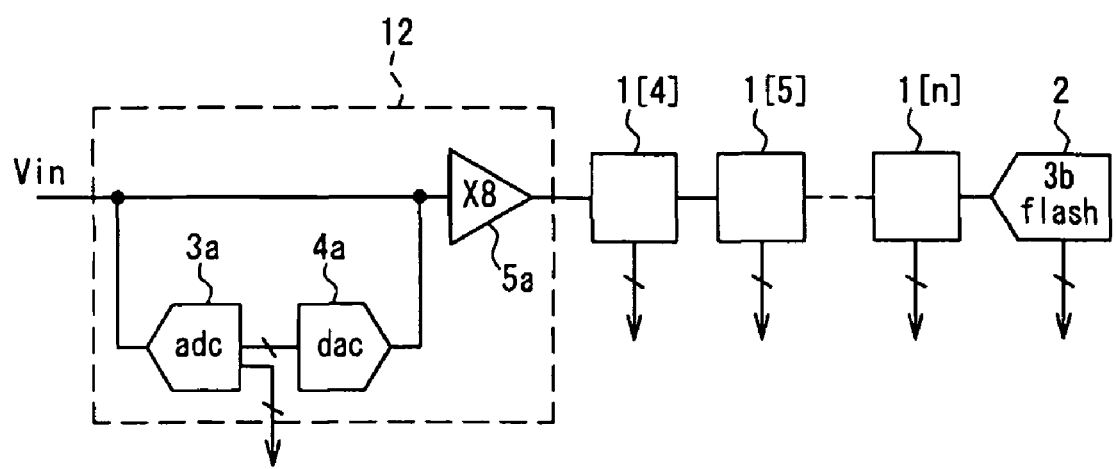
FIG. 4 is a block diagram showing another configuration of a conventional pipeline A/D converter.

The pipeline A/D converter of the present embodiment is configured in the same manner as the conventional pipeline A/D converter shown in FIG. 4 except for the first stage. The first stage of the present embodiment has features in a logical operation portion and voltage supply portions, while the other components thereof have the same configuration as those of the first stage in the conventional example shown in FIG. 6A.

The first stage shown in FIG. 1A includes an AD conversion portion 14, a logical operation portion 20, voltage supply portions 21[1] to 21[8], an operational amplifier 8, input capacitors Cs, a feedback capacitor Cf, and switches 17 and 18. In the present embodiment, the eight input capacitors Cs, which are connected in parallel with each other, are used, and an input analog signal Vin is supplied to first ends thereof and the other ends thereof are connected to an input terminal of the operational amplifier 8. The switch 17 is inserted in one end of each of the input capacitors Cs.

The eight voltage supply portions 21[1] to 21[8] in combination with the logical operation portion 20 configure a DA conversion portion. In the following description, the voltage supply portion 21[1] arranged at the top of the figure is referred to as an auxiliary voltage supply portion, and the other voltage supply portions 21[2] to 21[8] are referred to as primary voltage supply portions. The difference therebetween will be described below.

Figures 6A, 6B:
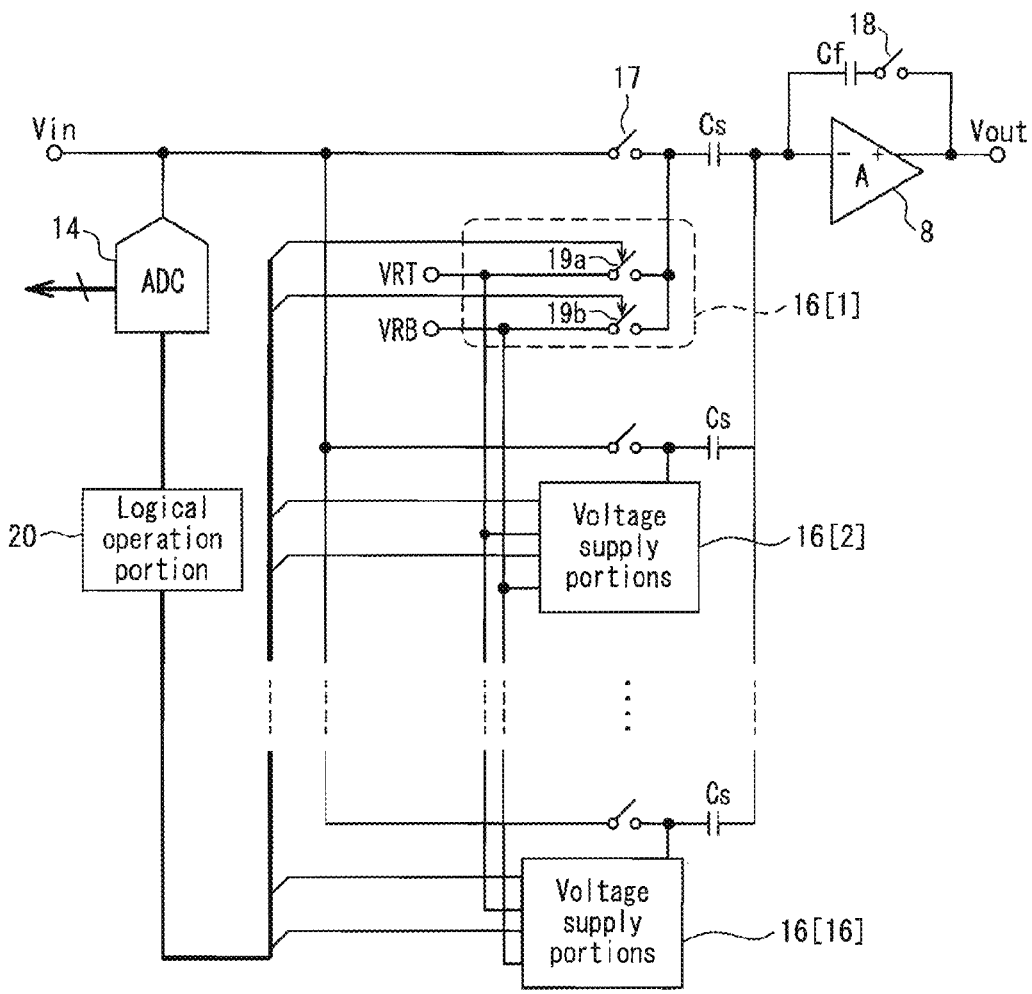
FIG. 6A is a block diagram showing a configuration of a first stage of the same pipeline A/D converter.
FIG. 6B is a table for explaining an operation of a DA conversion portion of the same pipeline A/D converter.

The primary voltage supply portions 2:[2] to 21[8] are configured to output selectively either of two reference voltages in the same manner as the voltage supply portion 16[1] and the like in the conventional example shown in FIG. 6A. More specifically, each of the primary voltage supply portions includes two switches 19a and 19b, and a reference voltage VRT and a reference voltage VRB are supplied to input sides of the switches 19a and 19b, respectively. Output sides of the switches 19a and 19b are connected to a connection node between any pair of the input capacitor Cs and the switch 17.

The auxiliary voltage supply portion 21[1] includes three switches 22a, 22b, and 22c, and reference voltages VRT, VRB, and VRM (=(VRT−VRB)/2) are supplied to input sides of the switches 22a, 22b, and 22c, respectively. Output sides of the switches 22a to 22c are connected to a connection node between any pair of the input capacitor Cs and the switch 17.

The reference voltage VRM is set at a level between the reference voltages VRT and VRB.

The switches 22a to 22c as well as the switches 19a and 19b included in the voltage supply portions 21[1] to 21[8] are switched by the logical operation portion 20 in accordance with a digital signal output from the AD conversion portion 14. With this configuration, each of the voltage supply portions 21[1] to 21[8] selectively outputs one of the three reference voltages VRM, VRT, and VRB or the two reference voltages VRT and VRB in accordance with the output from the AD conversion portion 14.

Figure 3A:
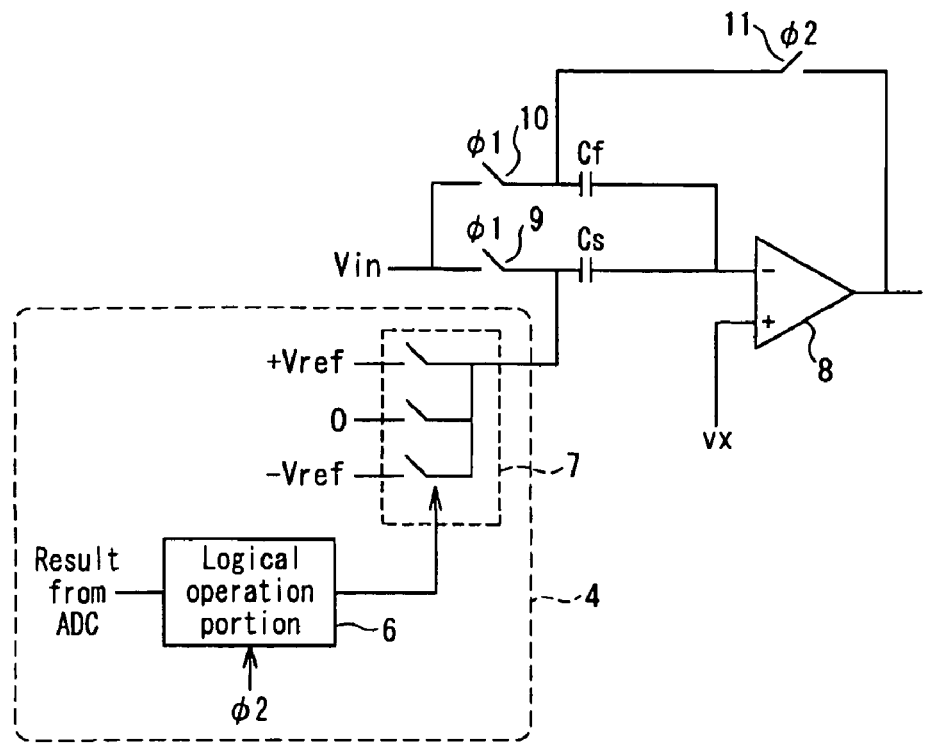
FIG. 3A is a block diagram showing a configuration of a unit stage of the same pipeline A/D converter.
Figure 3B:
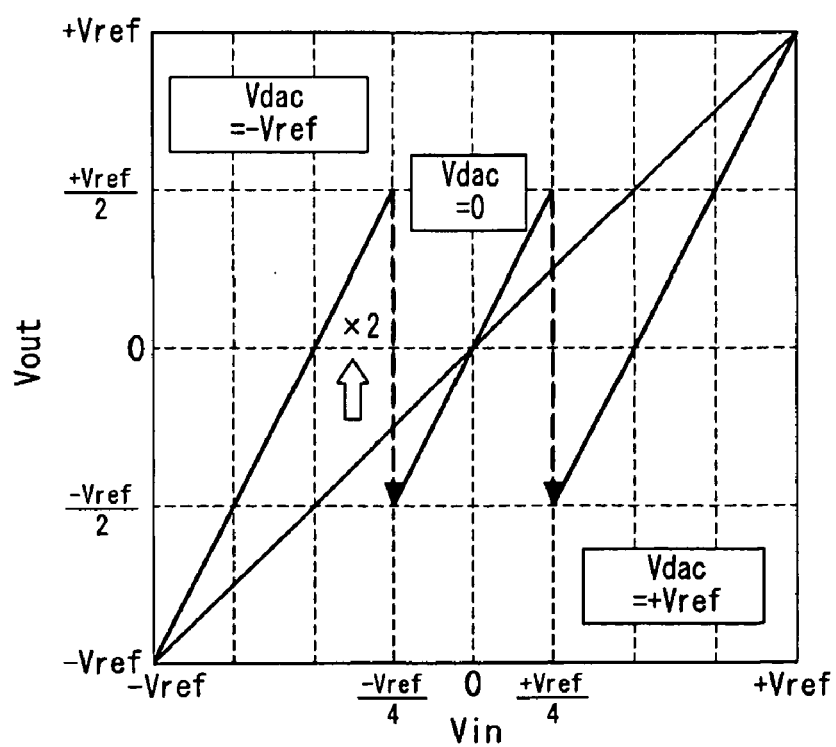
FIG. 3B is a diagram showing a transfer function of the same unit stage.
Figure 5A:
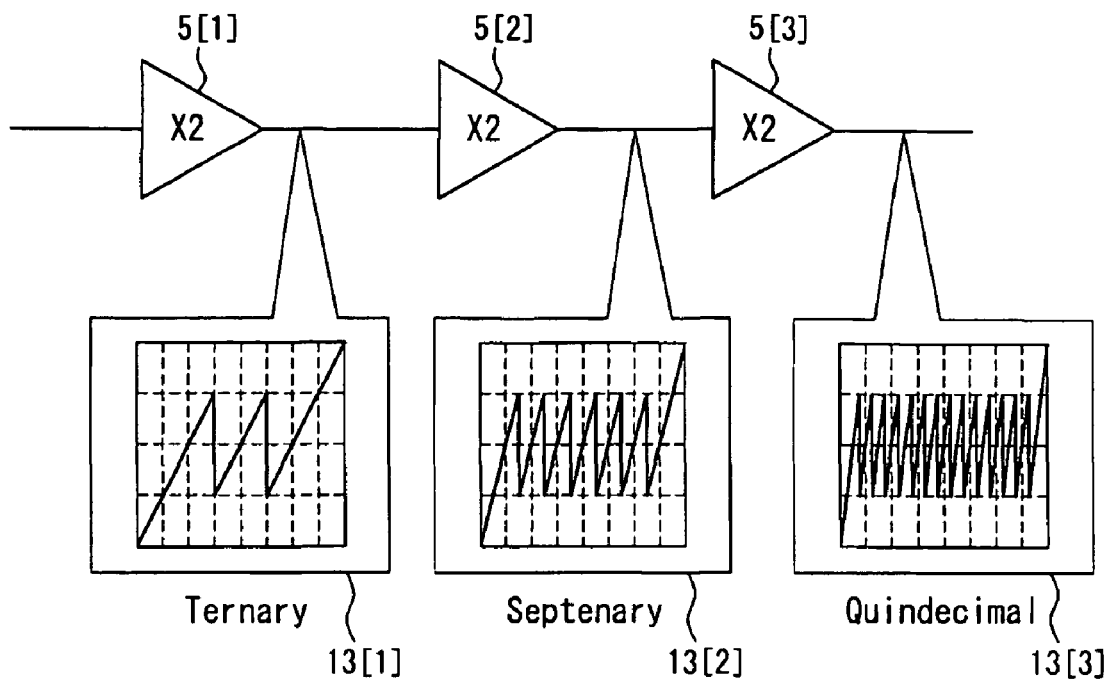
FIG. 5A is a diagram showing a function of the pipeline A/D converter shown in FIG. 2.
Figure 5B:
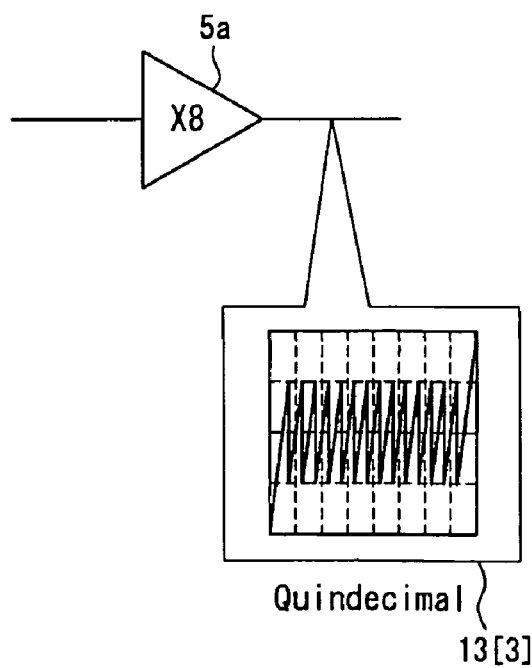
FIG. 5B is a diagram showing a function of the pipeline A/D converter shown in FIG. 4.

As a result, based on a combination of the respective reference voltages supplied from the voltage supply portions 21[1] to 21[8] to the eight input capacitors Cs, practically, a quindecimal analog reference signal Vdac in accordance with the output from the AD conversion portion 14 is supplied to a reminder operation portion. The reminder operation portion is operated basically in the same manner as described with reference to FIG. 3A, and outputs a transfer function based on the quindecimal quantization as shown in FIG. 5B.

Figures 1B, 2:
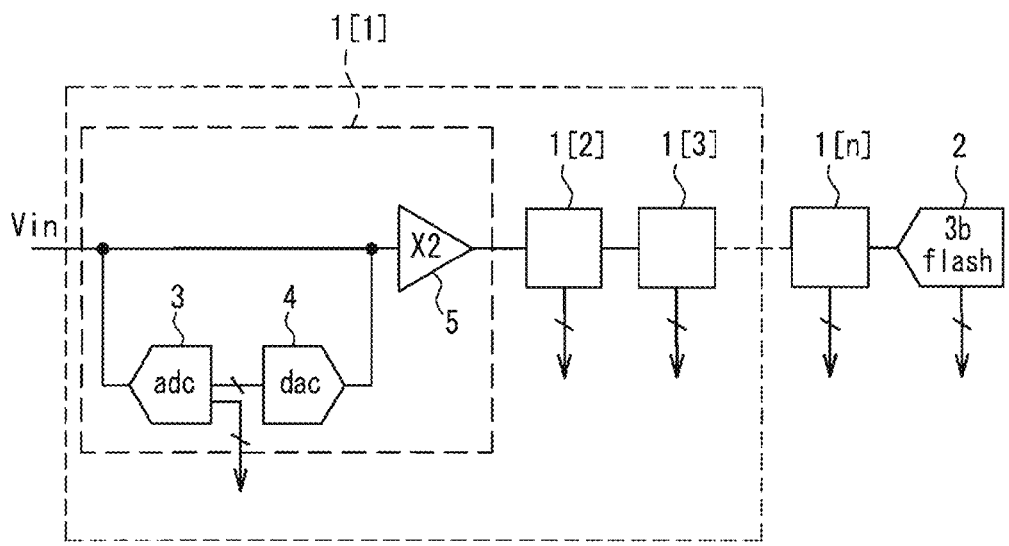
FIG. 1B is a table for explaining an operation of a DA conversion portion of the same pipeline A/D converter.
FIG. 2 is a block diagram showing a basic configuration of a conventional pipeline A/D converter.

The table of FIG. 1B shows the relationship between a combination of the reference voltages VRM, VRT, and VRB selected by the auxiliary voltage supply portion 21[1] and the primary voltage supply portions 21[2] to 21[8] and the value of the analog reference signal Vdac. In the table, A to O shown in the leftmost column correspond to the levels of the input analog signal Vin, more specifically, to fifteen values obtained as a result of the quantization by the AD conversion portion 14. Further, (−7) through 0 to (+7) shown in the rightmost column represent the relative levels of the analog reference signal Vdac. The voltage supply portions (1 to 8) in the uppermost column correspond to the voltage supply portion 21[1] to 21[8], and the reference voltage selected by the switches 22a to 22c and the switches 19a and 19b is shown in a lower column of each of the voltage supply portions.

More specifically, regarding the auxiliary voltage supply portion 21[1], "−1" shows that the reference voltage VRB is selected, while "0" shows that the reference voltage VRM is selected. Regarding the primary voltage supply portions 21[2] to 21[8], "−1" shows that the reference voltage VRB is selected, while "1" shows that the reference voltage VRT is selected. As shown in FIG. 1B, the auxiliary voltage supply portion 21[1] in the present embodiment is configured to select only the reference voltage VRB or the reference voltage VRM.

As described above, the first stage of the present embodiment is required to have the eight voltage supply portions so as to perform conversion of three bits. In general, the number of the voltage supply portions to be required is determined as $2^M$ with respect to the number of bits (M) to be converted in the first stage.

As described above, the first stage has a multi-bit, i.e., three-bit, configuration, with the one operational amplifier performing the functions of three stages, thereby reducing power consumption. Further, since the DA conversion portion used in the first stage can be composed of 2M voltage supply portions, it is possible to suppress an increase in the block area of the DA conversion portion by half. Consequently, it is possible to avoid an increase in the area of an element, an increase in the complexity of wiring, and complication in routing wiring in a layout. Further, with the first stage of a three-bit configuration, the operational amplifier is allowed to have output accuracy similar to that in a third stage with a conventional one-bit conversion configuration, resulting in an allowable output error voltage four times as high as before.

In the above-described configuration, the one auxiliary voltage supply portion 21[1] is provided. However, a plurality of the auxiliary voltage supply portions also may be provided. Further, regarding the setting of the reference voltages VRM, VRT, and VRB, the number of the levels, the values of the levels, and the like thereof are not limited to those described above.

Further, the present invention is not limited to the case where the first stage has a three-bit configuration, and the concept of the present invention also can be adopted for a multi-bit configuration other than the three-bit configuration. In such a case, the number of the auxiliary voltage supply portions, the number of the levels and the values of the levels of the reference voltage, and the like may be set in accordance with the number of bits to be converted.

Further, the reference voltages in the first stage can be set to be different from those in other stages as appropriate. In other words, a dedicated power supply may be used for a stage where the auxiliary voltage supply portion is provided, while a shared power supply may be used for other stages.

As described above, according to the present invention, it is possible to reduce power consumption while suppressing an increase in the area of an element. Thus, the present invention is useful as a pipeline A/D converter for use in a CCD camera, for example, in the fields of audiovisual, telecommunication, and the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A pipeline A/D converter having a plurality of stages connected in cascade, each performing A/D conversion for each part of bits, so as to convert an analog signal input to a first stage into a digital signal sequentially in descending order of bit significance through the plurality of stages, each of the stages comprising:

an AD conversion portion that quantizes the input analog signal of a current stage so as to generate the digital signal corresponding to the part of bits;

a DA conversion portion that generates an analog reference signal based on the digital signal output from the AD conversion portion; and a remainder operation portion that adds/subtracts the analog reference signal to/from the input analog signal of the current stage and amplifies the obtained analog signal by a predetermined factor so as to generate a remainder analog signal, and supplies the reminder analog signal to a subsequent stage as the input analog signal, wherein the first stage among the plurality of stages is configured to perform A/D conversion of a plurality of bits, the DA conversion portion of the first stage includes: a plurality of primary voltage supply portions capable of selectively outputting a reference voltage at one of a plurality of predetermined levels; and at least one auxiliary voltage supply portion capable of outputting a reference voltage at an auxiliary level different from the level of the reference voltage output from the primary voltage supply portions, and the reference voltages output respectively from the primary voltage supply portions and the auxiliary voltage supply portion are controlled so as to be selected based on the digital signal generated by the AD conversion portion, and based on a combination of the outputs from the primary voltage supply portions and the auxiliary voltage supply portion, the analog reference signal in accordance with the digital signal is generated.

2. The pipeline A/D converter according to claim 1, wherein the reference voltage at the auxiliary level is set at a level between the plurality of levels of the reference voltage to be output from the primary voltage supply portions.

3. The pipeline A/D converter according to claim 2, wherein the reference voltage to be output from the auxiliary voltage supply portion includes a reference voltage at least one of the plurality of levels of the reference voltage to be output from the primary voltage supply portions, in addition to the reference voltage at the auxiliary level.

4. The pipeline A/D converter according to claim 3, wherein the primary voltage supply portions output the reference voltage at either of two levels, that is, a high-potential level and a low-potential level, and the reference voltage to be output from the auxiliary voltage supply portion includes the reference voltage at the auxiliary level between the high-potential level and the low-potential level and a reference voltage at either the high-potential level or the low-potential level.

5. The pipeline A/D converter according to claim 4,
wherein the first stage is configured to perform A/D conversion of three bits, and
seven primary voltage supply portions and the one auxiliary voltage supply portion are provided.

6. A digital camera comprising the pipeline A/D converter according to claim 1.

* * * * *